(12) United States Patent
Kuo (10) Patent No.: US 9,640,502 B2
(45) Date of Patent: May 2, 2017

(54) STACKED SEMICONDUCTOR DEVICE (71) Applicant: UNITED MICROELECTRONICS CORP., Hsin-Chu (TW)

(72) Inventor: Po-Chen Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/700,160

(22) Filed: Apr. 30, 2015

(65) Prior Publication Data
US 2016/0300808 A1 Oct. 13, 2016

(30) Foreign Application Priority Data
Apr. 7, 2015 (TW) ................ 104111140 A (51) Int. Cl.
| H01L 23/48 | (2006.01) |
| H01L 23/00 | (2006.01) |
| H01L 25/065 | (2006.01) |
| H01L 25/00 | (2006.01) |
| H01L 23/498 | (2006.01) |

(52) U.S. Cl.
CPC ........ H01L 24/16 (2013.01); H01L 23/49811 (2013.01); H01L 25/0657 (2013.01); H01L 25/50 (2013.01); H01L 23/49816 (2013.01); H01L 2224/0401 (2013.01); H01L 2224/1308 (2013.01); H01L 2224/13016 (2013.01); H01L 2224/13017 (2013.01); H01L 2224/16148 (2013.01); H01L 2224/16238 (2013.01); H01L 2225/06513 (2013.01); H01L 2924/06 (2013.01); H01L 2924/07025 (2013.01)

(58) Field of Classification Search
CPC . H01L 23/49816; H01L 24/16; H01L 25/012; H01L 23/013; H01L 25/043; H01L 25/105
USPC .......... 257/737, 738, 686, 777, 778
See application file for complete search history.

(56) References Cited

U.S. PATENT DOCUMENTS

| 6,835,595 B1 * | 12/2004 | Suzuki | ............... H01L 21/56 257/701 |
| 6,972,490 B2 * | 12/2005 | Chang | ............... H01L 23/49816 257/737 |
| 8,227,916 B2 | 7/2012 | Wei | |
| 8,698,306 B2 | 4/2014 | Yu | |
| 2013/0270699 A1 | 10/2013 | Kuo | |
| 2013/0277830 A1 * | 10/2013 | Yu | ............... H01L 24/16 257/737 |
| 2014/0087522 A1 | 3/2014 | Yang | |

* cited by examiner

Primary Examiner — Hung Vu
(74) Attorney, Agent, or Firm — Winston Hsu; Scott Margo (57) ABSTRACT

A stacked semiconductor device is provided in the present invention. The stacked semiconductor device includes a first substrate and a second substrate. A first conductive pad is disposed on the first substrate. A conductive pillar contacts the first conductive pad. At least one first barrier layer is disposed inside the conductive pillar. The conductive pillar encapsulates the first barrier layer. The elastic modulus of the first barrier layer is different from the elastic modulus of conductive pillar. A second conductive pad is disposed on the second substrate. A solder bump is disposed between the first substrate and the second substrate. The solder bump electrically connects to the conductive pillar. The conductive pillar can optionally include a truncated cone.

9 Claims, 8 Drawing Sheets

STACKED SEMICONDUCTOR DEVICE

BACKGROUND OF THE INVENTION

1. Field of the Invention

The present invention relates to a stacked semiconductor device, more particularly to a conductive pillar of a stacked semiconductor device which can decrease the delamination problem due to temperature changes.

2. Description of the Prior Art

The current trend in the electronic industry is to manufacture lighter, smaller, faster, multifunctional, and high-performance products at lower costs. To accomplish these objectives, multi-chip stacked package technology is used.

The multi-chip stacked package technology can reduce the overall volume and improve the electrical performance of the package and thus becomes a primary type of package in the industry. In the multi-chip stacked package, at least two semiconductor chips are mounted on a chip carrier and each of the chips is stacked on the chip carrier in a vertical manner.

However, the effect of differences in the coefficients of thermal expansion (CTE) between chips used in a semiconductor package can lead to detrimental defects as a result of temperature change.

SUMMARY OF THE INVENTION

One aspect of the disclosed embodiments provides a stacked semiconductor device includes a first substrate, a first conductive pad disposed on the first substrate, a conductive pillar contacting the first conductive pad, at least one first barrier layer disposed inside the conductive pillar, wherein the conductive pillar encapsulates the first barrier layer, and an elastic modulus of the first barrier layer is different from an elastic modulus of the conductive pillar. The stacked semiconductor device further includes a second substrate, a second conductive pad disposed on the second substrate and a solder bump disposed between the first substrate and the second substrate, wherein the solder bump electrically connects to the conductive pillar.

Another aspect of the disclosed embodiments provides a stacked semiconductor device includes a first substrate, a first conductive pad disposed on the first substrate, a first conductive pillar contacting the first conductive pad, wherein the conductive pillar comprises a truncated cone. The stacked semiconductor device further includes a second substrate, a second conductive pad disposed on the second substrate and a solder bump disposed on the second substrate, wherein the solder bump electrically connects to the conductive pillar.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 4 to FIG. 6, FIG. 9 to FIG. 10 depict a method of fabricating a stacked semiconductor device according to a second preferred embodiment of the present invention.

FIG. 7 depicts a stacked semiconductor device schematically according to a third preferred embodiment of the present invention.

FIG. 12 depicts a stacked semiconductor device according to a sixth preferred embodiment of the present invention.

DETAILED DESCRIPTION

FIG. 1 to FIG. 7 depict a method of fabricating a stacked semiconductor device according to a first preferred embodiment of the present invention. As show in FIG. 1, a first substrate 10 is provided. The first substrate 10 may be a chip, an interposer, a PCB board or a substrate. Circuits are arranged on the first substrate 10. For example, the first substrate 10 may be a substrate which went through a BEOL process, and a metal interconnection 12 is formed on the first substrate 10. Later, a barrier layer 14 is optionally formed on the metal interconnection 12. The method of forming the barrier layer 14 may include forming a barrier material (not shown). Then, the barrier material is patterned to become the barrier layer 14. Later, a conductive layer (not shown) is formed conformally to cover the barrier layer 14. After that, the conductive layer is patterned to become a first conductive pad 16 which electrically connects to the metal interconnection 12. Subsequently, a protective layer 18 is formed to cover the first conductive pad 16. The protective layer 18 has an opening 20 so as to make the first conductive layer 16 expose through the opening 20.

Figure 1:
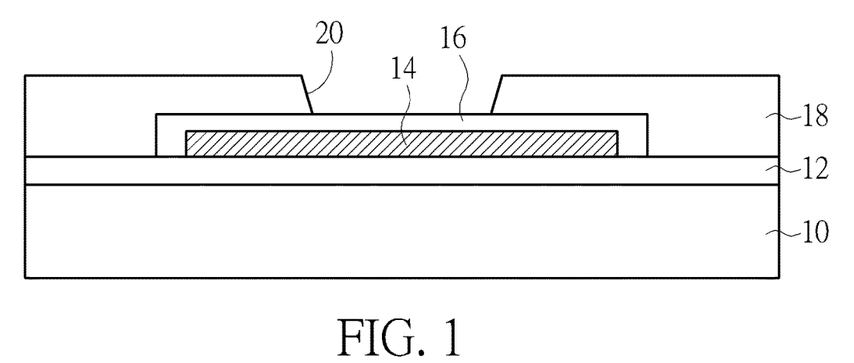
FIG. 1 to FIG. 7 depict a method of fabricating a stacked semiconductor device according to a first preferred embodiment of the present invention.
Figure 2:
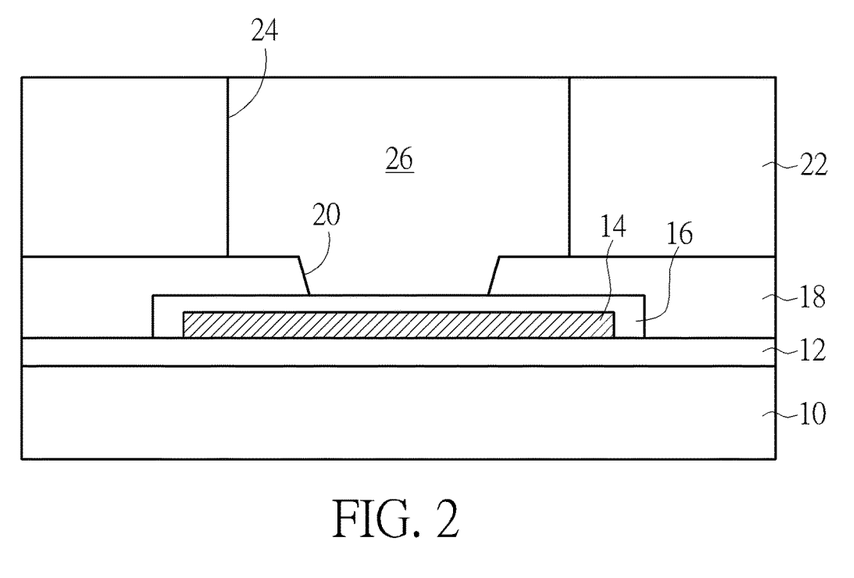

As shown in FIG. 2, a solder mask such as a photoresist 22 is formed on the protective layer 18. The photoresist 22 has an opening 24 to expose the first conductive pad 16 and part of the protective layer 18. Next, an under bump metallization (not shown) and a seed layer (not shown) are optionally formed on the first conductive pad 16. Later, a conductive piece 26 is formed within the opening 24 of the photoresist 22 and the opening 20 of the protective layer 18 by electroplating. The shape of the conductive piece 26 can be changed by adjusting the shape of the opening 24. For example, if the opening 24 is in a shape of a cube or a truncated cone, the conductive piece 26 above the protective layer 18 will be shaped into a corresponding cube or a corresponding truncated cone. Next, the photoresist 22 is removed.

Figure 3:
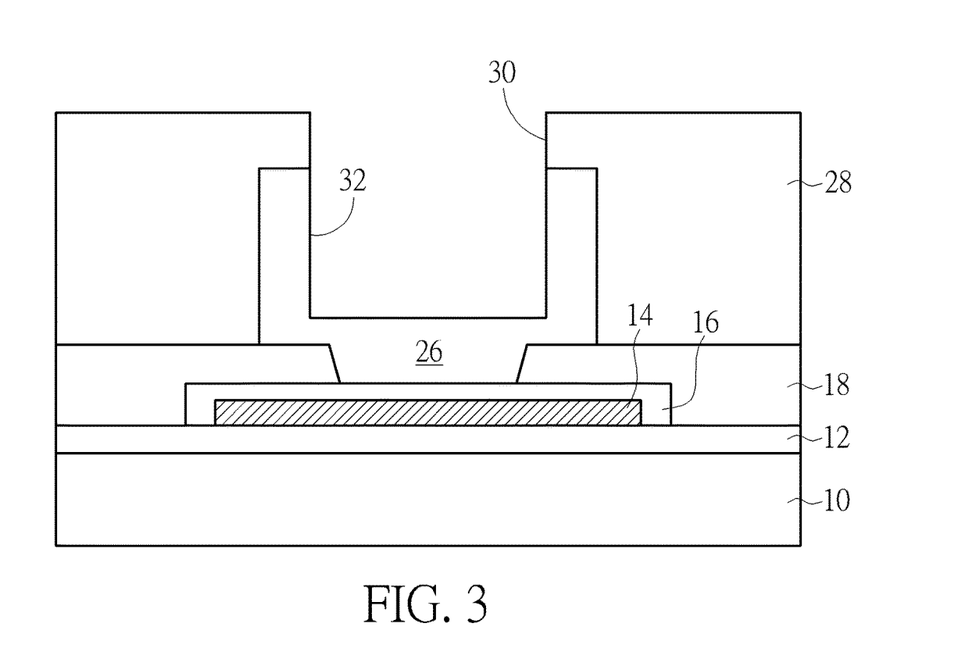
Figure 4:
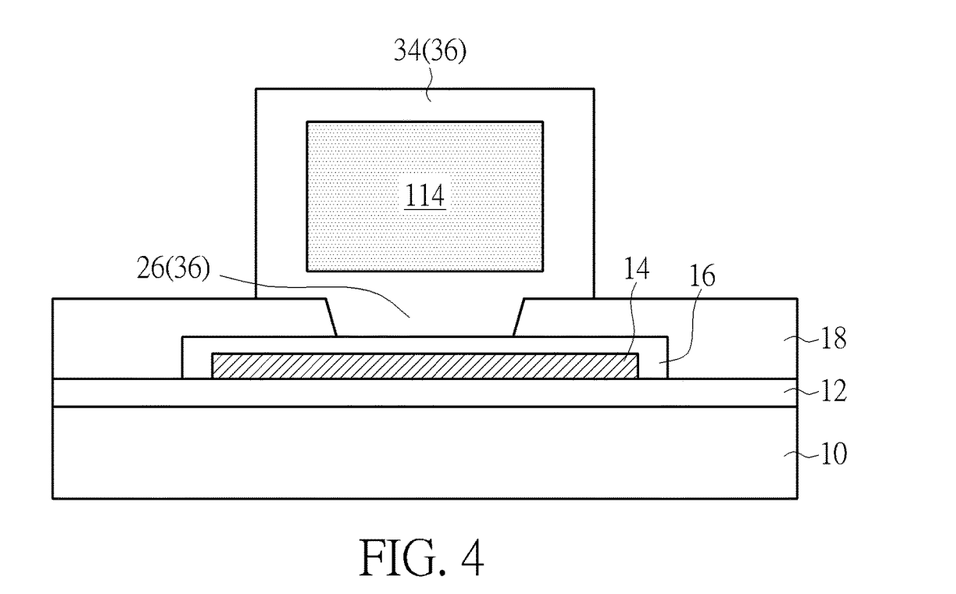
Figure 5:
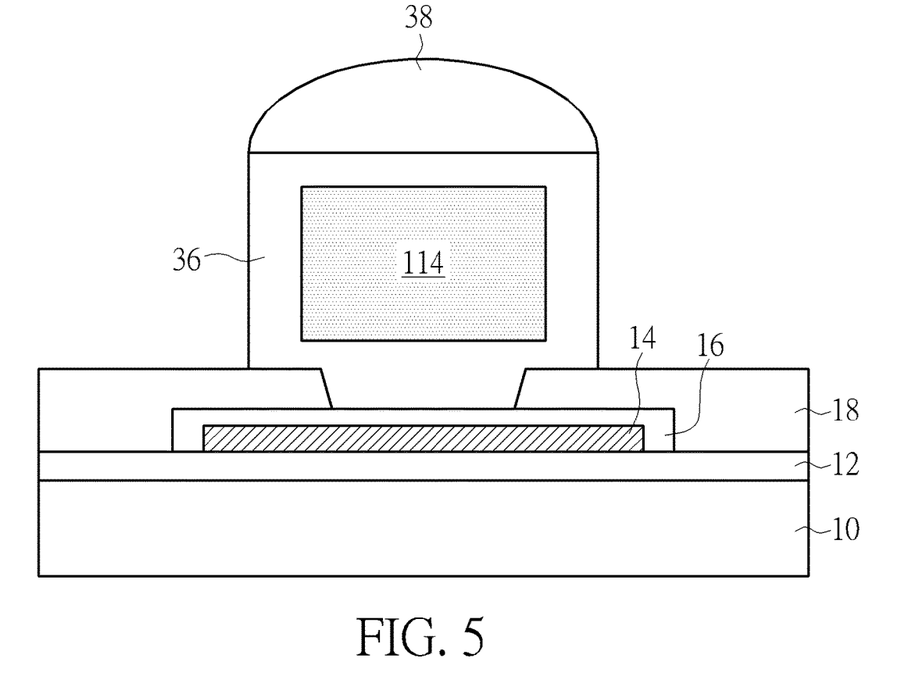

As shown in FIG. 3, a photoresist 28 is formed. The photoresist 28 has an opening 30 so as to expose part of the conductive piece 26. Next, the conductive piece 26 is removed partly by a wet etching to form a recess 32 within the conductive piece 26. However, the wet etching must be stopped before the first conductive pad 16 is exposed. Therefore, the bottom of the recess 32 is formed by the conductive pad 26. As shown in FIG. 4, at least one barrier layer 114 is filled into the recess 32. Later, a conductive cap 34 formed by electroplating covers the barrier layer 114 entirely. The conductive cap 34 and the conductive piece 26 consists a conductive pillar 36 which is hollow, and the conductive pillar 36 encapsulates the barrier layer 114. As shown in FIG. 5, after the photoresist 28 is removed, a nickel layer (not shown) is optionally formed on the conductive pillar 36. Then, a solder paste 38 is formed on the nickel layer. The solder paste comprises tin. The solder paste 38 will be used to form a solder bump in the reflow process performed afterwards.

Figure 6:
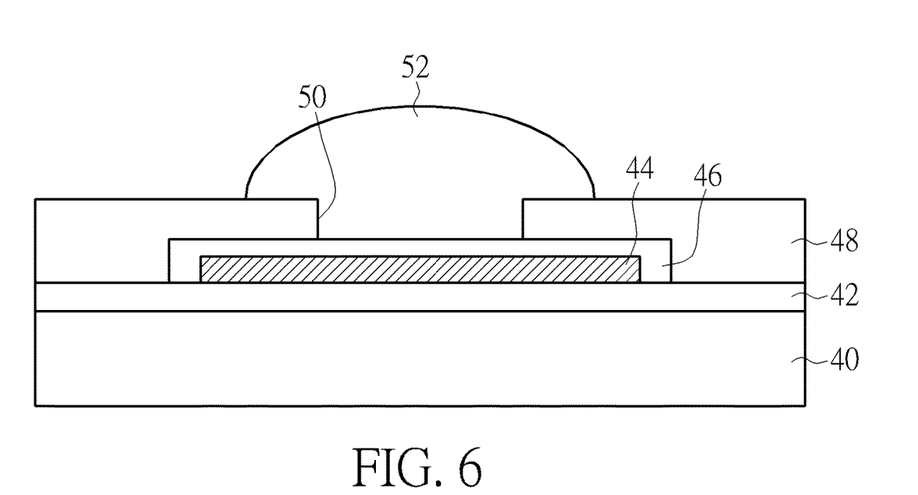

As shown in FIG. 6, a second substrate 40 is provided. The second substrate 40 may be a chip, an interposer, a PCB board or a substrate. Circuits 42 are arranged on the second substrate 40. Later, a barrier layer 44 is optionally formed on the circuits 42. The method of forming the barrier layer 44 may include forming a barrier material (not shown). Then, the barrier material is patterned to become the barrier layer 44. Later, a conductive layer (not shown) is formed conformally to cover the barrier layer 44. After that, the conductive layer is patterned to become a second conductive pad 46 which electrically connects to the circuits 42. Subsequently, a protective layer 48 is formed to cover the second conductive pad 46. The protective layer 48 has an opening 50 so as to make the second conductive layer 46 exposed through the opening 50. Then, a solder paste 52 is formed on the second conductive layer 46. The fabrication of the second conductive pad 46 and the barrier layer 44 on the second substrate 40 is independent to the fabrication of the conductive pillar 36, the barrier layers 14/114 and the first conductive pad 16. That is, the timing of making the elements on the first substrate 10 does not influence the timing of making the elements on the second substrate 40 as long as the solder paste 38 on the first substrate 10 and the solder paste 52 on the second substrate 40 are completed before a reflow process.

Figure 7:
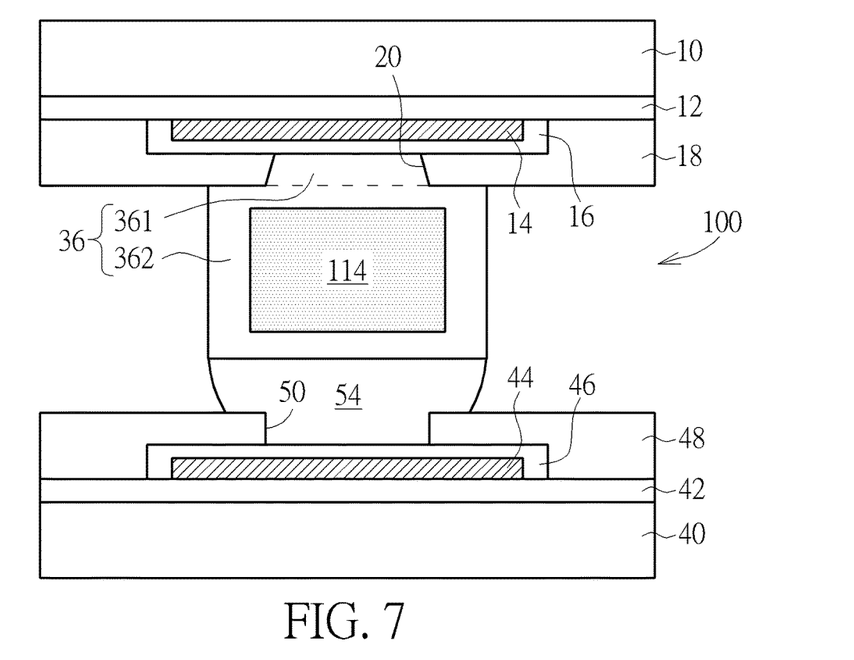

As shown in FIG. 7, a reflow process is performed by contacting the solder paste 38 to the solder paste 52, then reflowing the solder paste 38 and solder paste 52 to form a solder bump 54. At this point, a stacked semiconductor device 100 of the present invention is completed.

Figure 9:
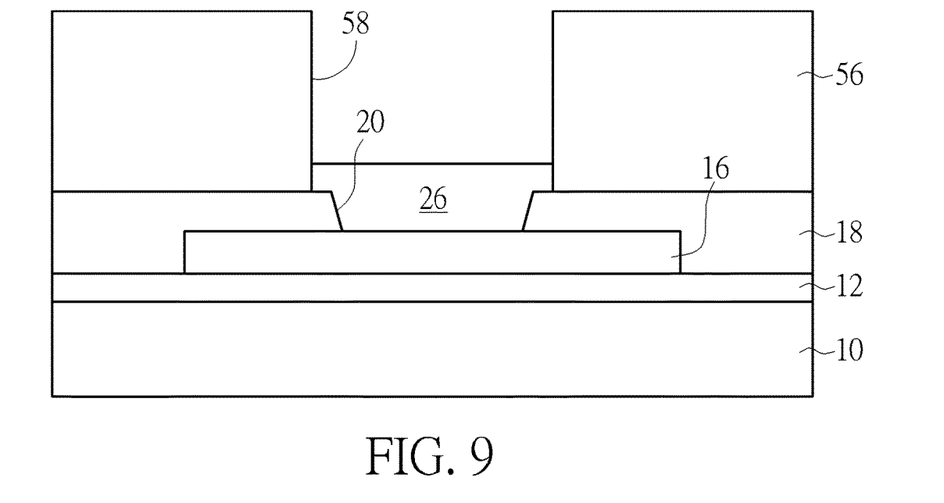
Figure 10:
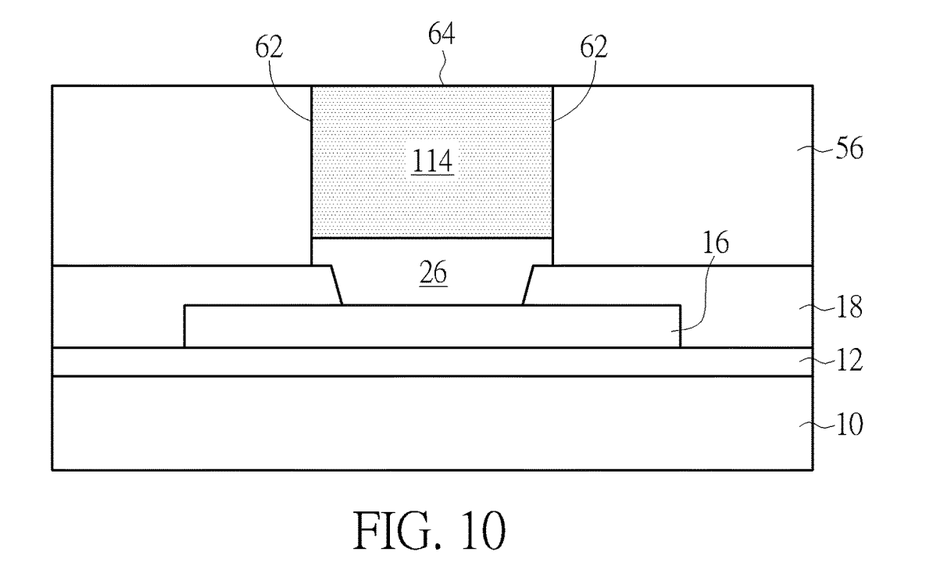

FIG. 1, FIG. 4 to FIG. 6, FIG. 9 to FIG. 10 depict a method of fabricating a stacked semiconductor device according to a second preferred embodiment of the present invention. The method illustrated in the second preferred embodiment can also form the stacked semiconductor device 100 shown in FIG. 7. As show in FIG. 1, a first substrate 10 is provided. Later, a barrier layer 14 is optionally formed on the first substrate 10. Next, a first conductive pad 16, a protective layer 18 and an opening 20 are formed on the first substrate 10. The fabricating steps of the conductive pad 16, the protective layer 18 and the opening 20 are illustrated in the previous paragraphs and therefore it is omitted here. As shown in FIG. 9, a solder mask such as a photoresist 56 is formed on the protective layer 18. The photoresist 56 has an opening 58 to expose the first conductive pad 16 and part of the protective layer 18. Next, an under bump metallization (not shown), a seed layer (not shown) and a conductive piece 26 are formed within the opening 58 of the photoresist 56 and the opening 20 of the protective layer 18. As shown in FIG. 9 and FIG. 10, a barrier layer 114 is filled into the opening 58. Therefore, the barrier layer 114 is formed on the conductive piece 26. The formation of the barrier layer 114 may include forming a barrier material (not shown) to cover the photoresist 56 and the conductive piece 26. Later, the barrier material is patterned to become the barrier layer 114. According to another preferred embodiment, the barrier material can be patterned into numerous barrier layers 114 (not shown). Next, the photoresist 56 is removed. Then, a conductive cap (not shown) is formed on the barrier layer 114. In detail, the conductive cap covers the sidewall 62 and the top surface 64 of the barrier layer 114. Furthermore, the conductive cap forms an inverted U shape that extending from the sidewall 62 to the conductive piece 26. Now, the conductive pillar 36 shown in FIG. 4 is formed. The conductive pillar 36 is hollow and encapsulates the barrier layer 114 entirely. Next, as shown in FIG. 5, a nickel layer (not shown) is optionally formed on the conductive pillar 36. Then, a solder paste 38 is formed on the nickel layer. The solder paste 38 comprises tin. The solder paste 38 will be used to form a solder bump in the reflow process performed afterwards. As shown in FIG. 6, a second substrate 40 is provided. A second conductive pad 46, a barrier layer 44, a protective layer 48 and a solder paste 52 are formed on the second substrate 40 by the method illustrated in the previous paragraphs. As shown in FIG. 7, a reflow process is performed by contacting the solder paste 38 to the solder paste 52, then reflowing the solder paste 38 and solder paste 52 to form a solder bump 54. At this point, a stacked semiconductor device 100 of the present invention is completed.

FIG. 7 depicts a stacked semiconductor device schematically according to a third preferred embodiment of the present invention. As shown in FIG. 7, a stacked semiconductor device 100 includes a first substrate 10. The first substrate 10 maybe a chip, an interposer, a PCB board or a substrate. Circuits are arranged on the first substrate 10. For example, the first substrate 10 may be a substrate which went through a BEOL process, and a metal interconnection 12 is formed on the first substrate 10. A first conductive pad 16 is formed on the first substrate 10, and the first conductive pad 16 electrically connects to the metal interconnection 12. A barrier layer 14 is optionally formed on the first substrate 10. The barrier layer 14 is disposed between the first conductive pad 16 and the metal interconnection 12. That is, the metal interconnection 12 and the first conductive pad 16 cooperatively encapsulate the barrier layer 14. Based on different requirements, the barrier layer 14 can be omitted. An elastic modulus of the barrier layer 14 is different from an elastic modulus of the first conductive pad 16. The elastic modulus of the barrier layer 14 is preferably greater than the elastic modulus of the first conductive pad 16. In addition, the number of the barrier layers 14 can be adjusted based on different requirements. In other words, there may be numerous barrier layers 14 arranged on the surface of the metal interconnection 12. The numerous barrier layers 14 do not contact each other. Furthermore, the shape of the barrier layer 14 is not limited. The cross section of the barrier layer 14 can be circle, rectangle or trapezoid. A protective layer 18 covers the first conductive pad 16. The protective layer 18 has an opening 20 to make the first conductive pad 16 exposed through the opening 20. The protective layer 18 includes silicon oxide, silicon nitride or other insulating materials. A conductive pillar 36 contacts and electrically connects to the first conductive pad 16. The conductive pillar 36 is divided into a first portion 361 and a second portion 362. The first portion 361 is disposed within the opening 20 of the protective layer 18. The second portion 362 is disposed outside of the opening 20. A dashed line is depicted on FIG. 7 to separate the first portion 361 and the second portion 362 for clarifying the positions of the first portion 361 and the second portion 362. A barrier layer 114 is disposed inside of the conductive pillar 36. The conductive pillar 36 encapsulates the barrier layer 114 entirely. Moreover, an elastic modulus of the barrier layer 114 is different from an elastic modulus of the conductive pillar 36. Preferably speaking, the elastic modulus of the barrier layer 114 is greater than the elastic modulus of the conductive pillar 36. The conductive pillar 36 may be a cube or other shapes. The material of the conductive pillar 36 may be copper, alloy or other metals. According to a preferred embodiment of the present invention, the conductive pillar 36 only consists of copper.

Figure 13:
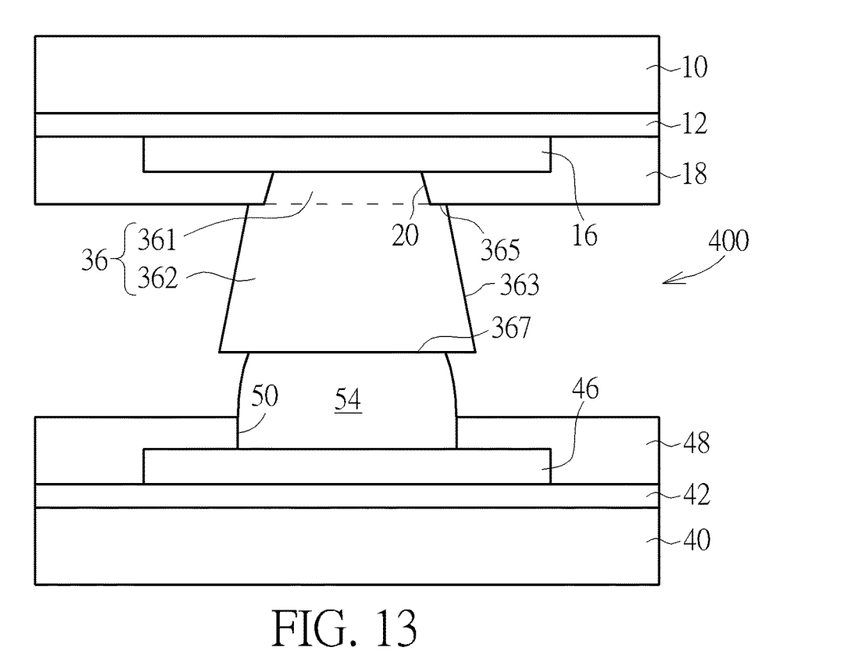
FIG. 13 depicts a stacked semiconductor device according to a seventh preferred embodiment of the present invention.
Figure 14:
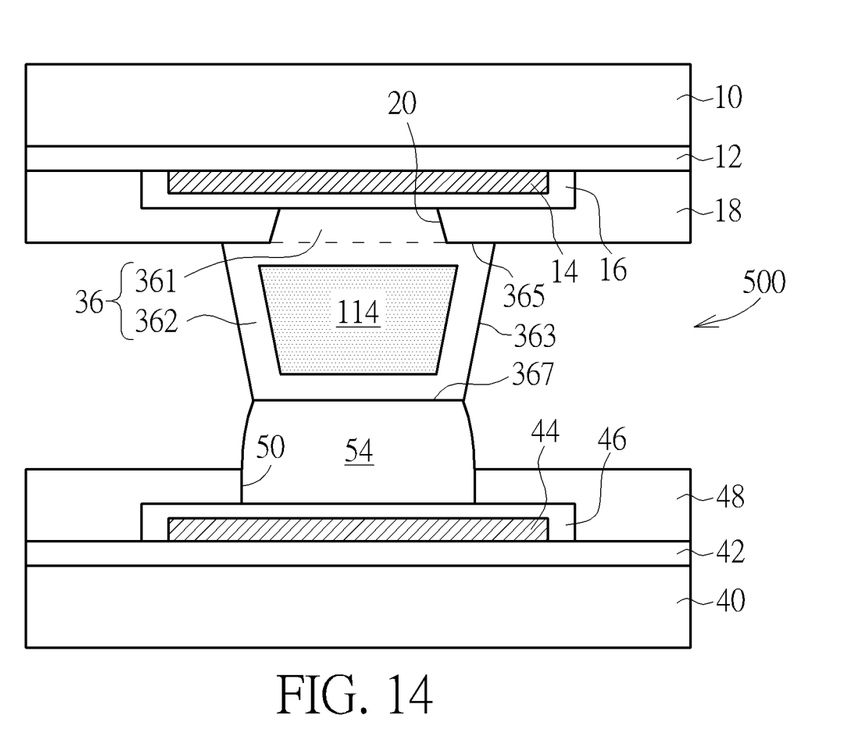
FIG. 14 depicts a stacked semiconductor device according to an eighth preferred embodiment of the present invention.

Please still refer to FIG. 7. The stacked semiconductor device 100 further includes a second substrate 40. The second substrate 40 may be may be a chip, an interposer, a PCB board or a substrate. Circuits 42 are arranged on the second substrate 40. A second conductive pad 46 is disposed on the second substrate 40. The second conductive pad 46 electrically connects to the circuits 42. A barrier layer 44 is optionally disposed on the second substrate 40. In detail, the barrier layer 44 is disposed between the second conductive pad 46 and the circuits 42. That is, the circuits 42 and the second conductive pad 46 cooperatively encapsulate the barrier layer 44 entirely. An elastic modulus of the barrier layer 44 is different from an elastic modulus of the second conductive pad 46. In addition, the number of the barrier layers 44 can be adjusted based on different requirements. In other words, there may be numerous barrier layers 44 arranged on the surface of the metal interconnection 42. The numerous barrier layers 44 do not contact each other. Furthermore, the shape of the barrier layer 44 is not limited. For example, the cross section of the barrier layer 44 can be circle, rectangle or trapezoid. A solder bump 54 is disposed between the first substrate 10 and the second substrate 40. The solder bump 54 electrically connects to the conduct pillar 36. In detail, the solder bump 54 is disposed between the first conductive pad 36 10 and the second conductive pad 46. A nickel layer (not shown) can optionally be between the conductive pillar 36 and the solder ball 54. In addition, there is not any barrier layer or other material which is not the solder ball disposed inside the solder ball 54. Because the solder ball 54 is liquid state at high temperature, and is soft at room temperature, the stress can be absorbed by the deformation of the solder ball 54 itself. Therefore, it is not necessary to put any barrier layer inside the solder ball 54. However, in other circumstances, there might be barrier layer disposed inside the solder ball 54. According to a preferred embodiment, the barrier layers 14/44/114 may be polymer such as polyimide (PI), benzocyclobuten (BCB), polybenzoxazole (PBO), plastic or resin. The barrier layers 14/44/114 may be conductive pieces formed by conductive materials. The barrier layers 14/44/114 may also be porous structures, honeycomb pore structures or netted texture formed by conductive materials. In addition, the solder bump 54 includes tin mixing with silver and copper. Lead may be optionally contained in the solder bump 54. It is noteworthy that the second portion 362 of the conductive pillar 36 has a cross section. The cross section may be a rectangular shown in FIG. 7. That is, the conductive pillar 36 includes a cube. In other ways, the cross section of the second portion 362 may be a trapezoid 363 as shown in FIG. 14. A dashed line is depicted on FIG. 14 to separate the first portion 361 and the second portion 362 for clarifying the positions of the first portion 361 and the second portion 362. The trapezoid 363 is preferably an isosceles trapezoid. In other words, the conductive pillar 36 comprises a truncated cone. The trapezoid 363 includes a first bottom 365 and a second bottom 367. The second bottom 367 is closer to the solder bump 54 than is the first bottom 365. The first bottom 365 is longer than second bottom 367. In other ways, the first bottom 365 can be shorter than the second bottom 367 as shown in FIG. 13. Please refer to FIG. 7. The number of the barrier layers 14/44/114 can be adjusted based on different conditions. Furthermore, the shapes of the barrier layers 14/44/114 are not limited. For example, the cross sections of the barrier layers 14/44/114 can be circle, rectangle or trapezoid. However, the shape of the barrier layer 114 and the shape conductive pillar 36 are preferably the same.

Figure 8:
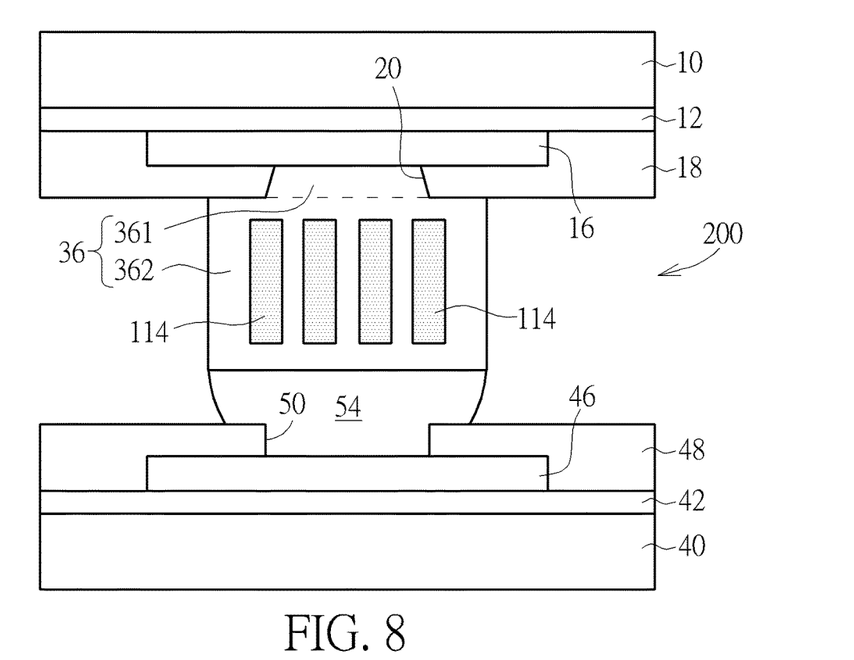
FIG. 8 depicts a stacked semiconductor device schematically according to a fourth preferred embodiment of the present invention.

FIG. 8 depicts a stacked semiconductor device schematically according to a fourth preferred embodiment of the present invention, wherein like reference numerals are used to refer to like elements throughout. The differences between the stacked semiconductor device 200 in FIG. 8 and the stacked semiconductor device 100 in FIG. 7 are that as shown in FIG. 8, numerous barrier layers 114 are disposed within the conductive pillar 36, and each barrier layers 114 do not contact each other; on the other hand, there is only one barrier layer 114 disposed within the conductive pillar 36. In addition, in the stacked semiconductor device 200 in FIG. 8, there is no barrier layer between the first conductive layer 16 and the metal interconnection 12, and no barrier layer between the second conductive pad 46 and the circuit 42. The mutual feature of the stacked semiconductor device 100 and the stacked semiconductor device 200 is that there must be at least one barrier layer 114 disposed inside the conductive pillar 36. The barrier layers 14/44 can be optionally disposed respectively in the first conductive pad 16 and the second conductive pad 46. The barrier layers 14/44/114 can be used to absorb the stress created from deformation of the first substrate 10 and the second substrate 40 during temperature fluctuation. In this way, delamination of the material layer on the first substrate 10 and on the second substrate 40 can be reduced.

Figure 11:
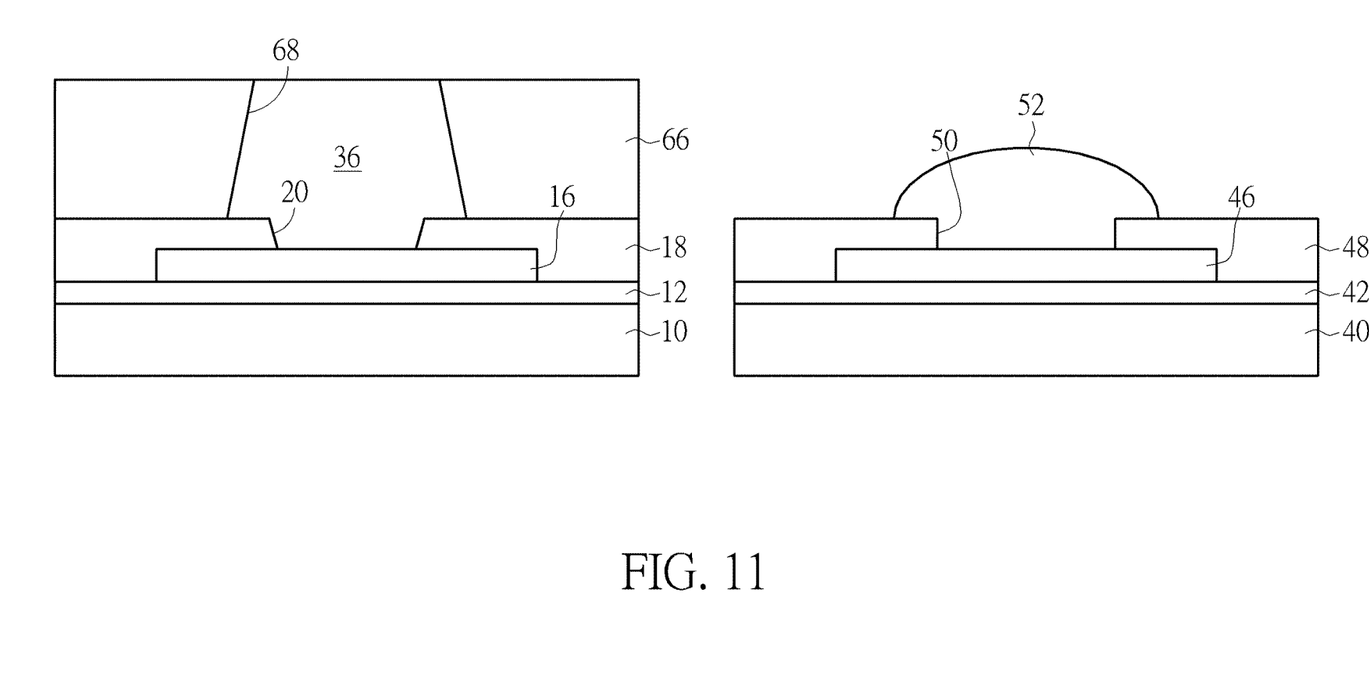
FIG. 11 to FIG. 12 depict a method of fabricating a stacked semiconductor device according to a fifth preferred embodiment of the present invention.
Figure 12:
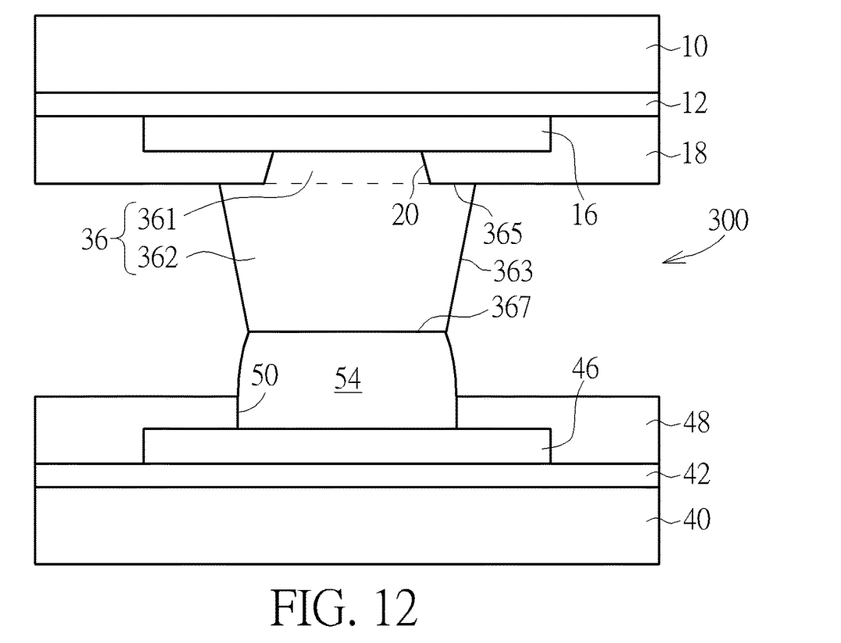

FIG. 11 to FIG. 12 depict a method of fabricating a stacked semiconductor device according to a fifth preferred embodiment of the present invention, wherein like reference numerals are used to refer to like elements throughout. As shown in FIG. 11, a first substrate 10 is provided. Next, a first conductive pad 16, a protective layer 18 and an opening 20 are formed on the first substrate. The fabricating steps of the conductive pad 16, the protective layer 18 and the opening 20 are substantially the same as that illustrated in the previous paragraphs and therefore are omitted herein. Next, a photoresist layer 66 is formed on the protective layer 18. The photoresist 66 has an opening 68 to expose the first conductive pad 16 and part of the protective layer 18. The opening 68 is in a shape of trapezoid. Next, a seed layer (not shown) is optionally formed on the first conductive pad 16. After that, a conductive pillar 36 is formed in the opening 68 of the photoresist 66 and the opening 20 of the protective layer 20 by electroplating. Then, the photoresist 66 will be removed followed by forming a solder paste (not shown) on the conductive pillar 36. Please still refer to FIG. 11. In the fifth embodiment, a second substrate 40 is provided. A second conductive pad 46, a protective layer 48 and a solder paste 52 are formed on the second substrate 10. The fabricating steps of the second conductive pad 46, the protective layer 48 and the solder paste 52 are substantially the same as that illustrated in the previous paragraphs for describing FIG. 6 and therefore are omitted herein. However, the difference between FIG. 6 and FIG. 11 is that there is no barrier layer between the second conductive pad 46 and the circuits 42 in FIG. 11. As shown in FIG. 12, a reflow process is performed by contacting the solder paste on the first substrate 10 to the solder paste 52 on the second substrate 40 so as to form a solder bump 54. At this point, a stacked semiconductor device 300 of the present invention is completed.

FIG. 12 depicts a stacked semiconductor device according to a sixth preferred embodiment of the present invention. FIG. 13 depicts a stacked semiconductor device according to a seventh preferred embodiment of the present invention, wherein like reference numerals are used to refer to like elements throughout. The difference between the stacked semiconductor device 300 in FIG. 12 and the stacked semiconductor device 100 in FIG. 7 is that there is no barrier layer on the first substrate 10, on the second substrate 40 and within the conductive pillar 36 in the stacked semiconductor device 300 in FIG. 12. Besides, the conductive pillar 36 is divided into a first portion 361 and a second portion 362, and the second portion 362 in FIG. 12 is in a shape of truncated cone. The second portion 362 has a cross section. The cross section of the second portion 362 maybe a trapezoid 363. The trapezoid 363 is preferably an isosceles trapezoid. The trapezoid 363 includes a first bottom 365 and a second bottom 367. The second bottom 367 is closer to the solder bump 54 than the first bottom 365 is. The first bottom 365 is greater than second bottom 367. In other ways, the first bottom 365 can be smaller than the second bottom 367 as shown in FIG. 13. The elements of the stacked semiconductor devices 300/400 in FIG. 12 and FIG. 13 substantially consist of the same materials and are disposed at the same position as the elements of the stacked semiconductor device 100 in FIG. 7, except the first bottom 365 and the second bottom 367 of the stacked semiconductor devices 300/400 have different lengths. Please refer to the paragraphs for describing FIG. 7 for reference of the elements in FIG. 12 and FIG. 13. The stacked semiconductor devices in the FIG. 12 and FIG. 13 specifically have the conductive pillar in a shape of truncated cone so as to disperse the strain caused by deformation of the first substrate and the second substrate due to temperature alteration. In this way, the delamination of the material on the first substrate and the second substrate can be decreased.

FIG. 14 depicts a stacked semiconductor device according to an eighth preferred embodiment of the present invention, wherein like reference numerals are used to refer to like elements throughout. The difference between the stacked semiconductor device 500 in FIG. 14 and the stacked semiconductor device 300 in FIG. 12 is that there is a barrier layer 114 disposed within the conductive pillar 36 in the stacked semiconductor device 500. Moreover, a barrier layer 14 is disposed between the first conductive pad 16 and the metal interconnection 12 in the stacked semiconductor device 500. Furthermore, a barrier layer 44 is disposed between the second conductive pad 46 and the circuits 42 in the stacked semiconductor device 500. Besides using the conductive pillar 36 having a truncated cone to disperse the strain caused by deformation of the first substrate 10 and the second substrate 40, the stacked semiconductor device 500 also has barrier layers 14/44/114 to absorb the strain resulting from the deformation of the first substrate 10 and the second substrate 40. In this way, the delamination on the first substrate 10 and the second substrate 40 can be decreased more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A stacked semiconductor device, comprising:
a first substrate;
a first conductive pad disposed on the first substrate;
a conductive pillar contacting the first conductive pad, wherein the conductive pillar comprises a truncated cone and copper;
a second substrate;
a second conductive pad disposed on the second substrate;
a solder bump disposed on the second substrate, wherein the solder bump electrically connects to the conductive pillar; and
at least one first barrier layer disposed within the conductive pillar, wherein the conductive pillar encapsulates the first barrier layer and an elastic modulus of the first barrier layer is different from an elastic modulus of the conductive pillar.

2. The stacked semiconductor device of claim 1, wherein the conductive pillar comprises a first portion and a second portion, the second portion comprises the truncated cone, the second portion comprises a cross section, and the cross section comprises a trapezoid.

3. The stacked semiconductor device of claim 2, wherein the cross section comprises a first bottom and a second bottom, and the second bottom is closer to the solder bump than the first bottom is.

4. The stacked semiconductor device of claim 3, wherein the first bottom is longer than the second bottom.

5. The stacked semiconductor device of claim 3, wherein the first bottom is shorter than the second bottom.

6. The stacked semiconductor device of claim 2, further comprising a protective layer covering the first conductive pad, wherein the protective layer comprises an opening, the first portion of the conductive pillar is disposed within the opening, the first portion contacts the first conductive pad, and the second portion of the conductive pillar is disposed outside of the opening.

7. The stacked semiconductor device of claim 1, wherein the first barrier layer comprises polyimide, benzocyclobuten, or polybenzoxazole.

8. The stacked semiconductor device of claim 1, further comprising a second barrier layer disposed on the first substrate, wherein the first conductive pad covers the second barrier layer, and the second barrier layer comprises polyimide, benzocyclobuten, or polybenzoxazole.

9. The stacked semiconductor device of claim 1, further comprising a third barrier layer disposed on the second substrate, wherein the second conductive pad covers the third barrier layer, and the third barrier layer comprises polyimide, benzocyclobuten, or polybenzoxazole.

* * * * *